United States Patent
Matsuo et al.

[11] Patent Number: 5,933,367
[45] Date of Patent: Aug. 3, 1999

[54] ERASING METHOD IN NONVOLATILE SEMICONDUCTOR MEMORY DEVICE

[75] Inventors: Makoto Matsuo; Ayumi Yokozawa, both of Tokyo, Japan

[73] Assignee: NEC Corporation, Tokyo, Japan

[21] Appl. No.: 09/040,746

[22] Filed: Mar. 18, 1998

[30] Foreign Application Priority Data

Mar. 18, 1997 [JP] Japan .................................. 9-064484

[51] Int. Cl.$^6$ .................................................. G11C 16/04
[52] U.S. Cl. ................................ 365/185.29; 365/185.18; 365/218
[58] Field of Search .................... 365/185.29, 218, 365/185.18

[56] References Cited

U.S. PATENT DOCUMENTS 5,452,248  9/1995  Naruke et al. .................... 365/185.29
5,726,933  3/1998  Lee et al. ........................... 365/185.29
5,781,477  7/1998  Rinerson et al. .................. 365/185.29

*Primary Examiner*—Son T. Dinh
*Attorney, Agent, or Firm*—Foley, Hoag & Eliot LLP

[57] ABSTRACT

A control gate is loaded with a negative voltage pulse and a source region is loaded with a positive constant voltage pulse while a drain region is at a floating state. More specifically, the absolute value of the voltage applied to the control gate is increased with time for a period from the start of a memory erasing action (the application of the pulse voltage) to 2 msec and then remains constant from 2 msec to the end of the memory erasing action. As the result, a potential difference between the source region and the control gate at the start of the memory erasing action is smaller than that at the end of the memory erasing action. This prevents the tunnel oxide layer from receiving a high electric field stress at the start of the memory erasing action, thus improving the write/erase endurance.

20 Claims, 4 Drawing Sheets

ERASING METHOD IN NONVOLATILE SEMICONDUCTOR MEMORY DEVICE

BACKGROUND OF THE INVENTION

1. Field of the Invention

The present invention relates to an erasing method in a nonvolatile semiconductor memory device to improve the write/erase endurance which may result from trapping of electrons in a tunnel oxide layer.

2. Description of the Related Art

FIG. 1 is a cross sectional view showing the structure of a memory cell. As shown in FIG. 1, a drain region 3 and a source region 4 are selectively formed at the surface of a semiconductor substrate 7. Also, a tunnel oxide layer 5 and a floating gate 2 are formed on a bridge area of the semiconductor substrate 7 between the drain region 3 and the source region 4. A control gate 1 is formed on the floating gate 2 via an interface layer 6 made of a polycrystalline silicon material.

A method of erasing memories in such memory cells is disclosed in Japanese Patent Application Laid-open No. 4-105368. FIG. 2 is a diagram showing a conventional method of erasing memories in the memory cell. It is assumed in FIG. 2 that the voltage applied to the drain region 3 is Vd, the voltage applied to the control gate 1 is Vcg, and the voltage applied to the source region 4 is Vs.

For writing data, for example, 12 V of the voltage is applied to the control gate 1 while 5 V of the voltage is applied to the drain region 3 with the source region 4 being grounded. At the time, electrons migrating from the source region 4 to the drain region 3 are accelerated by a high intensity of electric field developed adjacent to the drain region 3. Some of electrons are drawn by a vertical component of the electric field and doped over a barrier of the tunnel oxide layer 5 into the floating gate 2.

In a memory erasing action shown in FIG. 2, for example, while the drain region 3 is kept at a floating state, the control gate 1 is loaded with a constant voltage pulse of −11 V and the source region 4 is loaded with 4 V of a constant voltage pulse. As the high electric field runs across the tunnel oxide layer 5, electrons are drawn from the floating gate 2 via the tunnel oxide layer 5 to the source region 4 by the effect of Fowler-Nordheim (FN) tunneling.

In the conventional memory erasing method, while the drain source 3 is at a floating state, the control gate 1 is loaded with a negative constant voltage pulse and the source region 4 is loaded with a positive constant voltage pulse for a period of 3 msec.

However, the conventional memory erasing method has a problem that some electrons are trapped in the tunnel oxide layer 5 by a high electric field stress and will result in decrease of the gate current. As the gate current is decreased, the write/erase endurance will be degraded. For example, the nonvolatile semiconductor memory device is used in place of a magnetic memory device such as a hard disk drive. Although the number of rewriting actions is desired about 100,000, the conventional memory erasing method may provide as small as 10,000 times of rewriting actions.

SUMMARY OF THE INVENTION

It is an object of the present invention to provide an erasing method in a nonvolatile semiconductor memory device, which can improve the write/erase endurance and increase the reliability of the semiconductor memory device.

An erasing method in a nonvolatile semiconductor memory device according to the present invention comprises the step of applying a negative voltage pulse to a control gate and a positive voltage pulse to a source region while a drain region being at a floating state. The nonvolatile semiconductor memory device has a semiconductor substrate of a first conductivity type, the source region and the drain region of a second conductivity type formed selectively at the surface of the semiconductor substrate, a first insulating layer formed on the semiconductor substrate, a floating gate formed on the first insulating layer, a second insulating layer formed on the floating gate, and the control gate formed on the second insulating layer. The negative and positive voltage pulses are controlled so that a potential difference between the voltage applied to the control gate and the voltage applied to the source region at the start of the pulse voltage application is smaller than that at the end of the pulse voltage application.

The absolute value of the voltage applied to either the control gate or the source region at the start of the pulse voltage application may be smaller than that at the end of the pulse voltage application and the absolute value of the voltage applied to the other may be constant.

It may be preferred that the voltage pulse applied to the source region is a constant voltage pulse and the voltage pulse applied to the control gate is a voltage pulse that its absolute value increases with time from the start of the pulse voltage application. It may also be possible that the voltage pulse applied to the control gate is a constant voltage pulse and the voltage pulse applied to the source region is a voltage pulse that its amplitude increases with time from the start of the pulse voltage application.

In the conventional memory erasing method which applies constant voltage pulses to both a control gate and a source region, the number of electrons in the floating gate at the start of the erasing action (the application of the pulse voltage) is greater than that at the end of the erasing action, hence causing an electric field developed across a first insulating layer (a tunnel oxide layer) at the start of the erasing action to be higher than that at the end of the erasing action.

According to the present invention, the potential difference of the pulse voltage between the control gate and the source region at the start of the memory erasing action is set smaller than that at the end of the erasing action. Therefore, as compared with the conventional erasing method in which the constant voltage pulse is applied to both the regions, the electric field developed across the first insulating layer at the start of the erasing action is decreased in intensity. This will minimize trapping of electrons in the first insulating layer caused by the effect of electric field stress, thus preventing the degradation of the write/erase endurance.

DETAILED DESCRIPTION OF THE PREFERRED EMBODIMENTS

Figure 3:
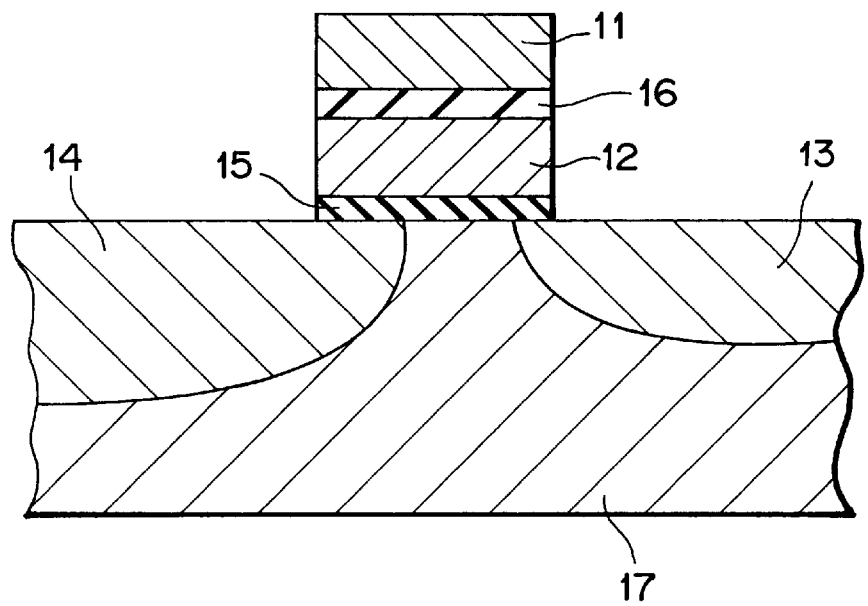
FIG. 3 is cross sectional view of the structure of a memory cell for explaining an erasing method in a nonvolatile semiconductor memory device according to the present invention.

Preferred embodiments of the present invention will be described in more detail referring to the accompanying drawings. FIG. 3 is a cross sectional view of the structure of a memory cell for explaining an erasing method of in a nonvolatile semiconductor memory device according to the present invention.

As shown in FIG. 3, a drain region 13 and a source region 14 are selectively formed at the surface of a semiconductor substrate 17. A tunnel oxide layer (a first insulating layer) 15 and a floating gate 12 are formed in layers bridging between the drain region 13 and the source region 14 over the semiconductor substrate 17. A control gate 11 is formed via an interface layer (a second insulating layer) 16 made of polycrystalline silicon on the floating gate 12. The structure of this memory cell is identical to that of a conventional memory cell.

Figure 4:
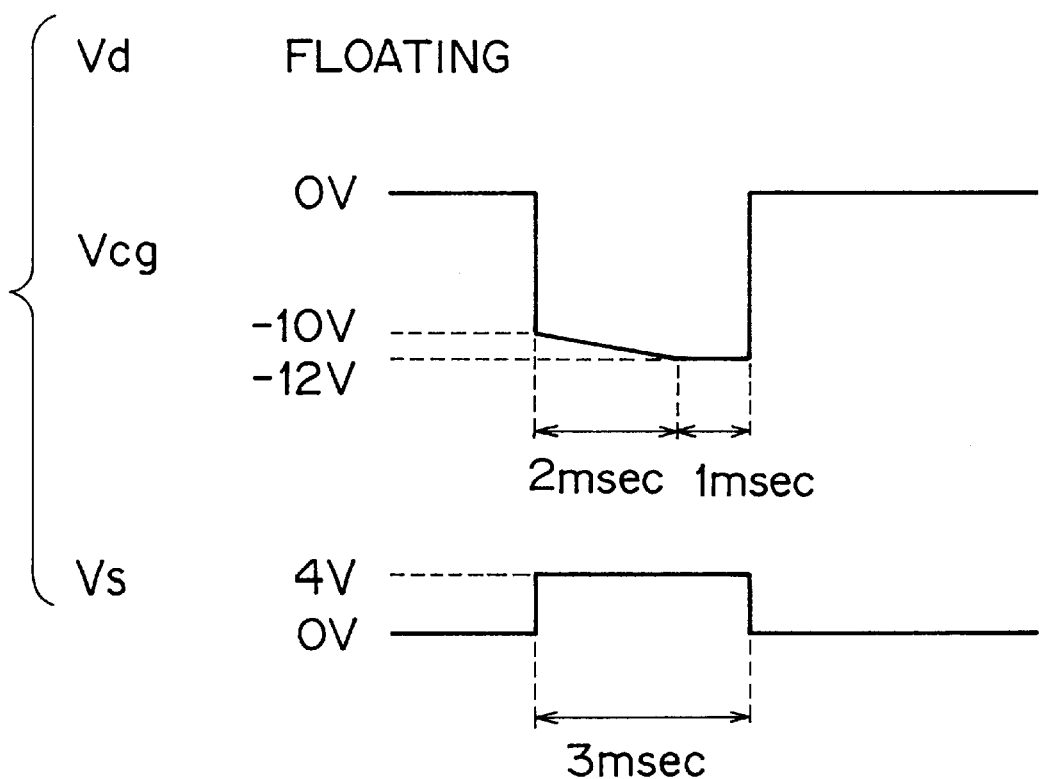
FIG. 4 is a diagram showing a first embodiment of the erasing method in a nonvolatile semiconductor memory device of the present invention.

An erasing action in the memory cell is now explained. FIG. 4 is a diagram showing a first embodiment of the erasing method in the nonvolatile semiconductor memory device of the present invention. It is assumed in FIG. 4 that a voltage applied to the drain region 13 is Vd, a voltage applied to the control gate 11 is Vcg, and a voltage applied to the source region 14 is Vs.

As shown in FIG. 4, in the memory erasing action of the first embodiment, a constant voltage pulse, e.g. 4 volts, is applied to the source region 14 while the drain region 13 is kept at a floating state. Also, the control gate 11 is loaded with such a negative voltage pulse as expressed by Equations (1) and (2). It should be noted that Vcg(t,t+Δt) is a voltage applied to the control gate 11 for memory erasing action. It is now assumed that Δt is 0.1 msec, Vcg(0) is 10 V, and dVcg is 0.1 V.

When 0≦t<2 (msec) is established, $$Vcg(t,t+\Delta t)=Vcg(0)+dVcg \times t \qquad (1)$$

When 2≦t≦3 (msec) is established, $$Vcg=12 \qquad (2)$$

As the control gate 11 has been loaded with a voltage determined by Equations (1) and (2), the absolute value of the control gate voltage will increase with time in a period from the start of the memory erasing action (application of the pulse voltage) to 2 msec later. The control gate voltage remains constant from 2 msec after the start of the erasing action to the end of the erasing action.

While the source region is loaded with the constant voltage pulse, a difference of the potential between the voltage applied to the source region and the voltage applied to the control gate at the start of the erasing action is smaller than that at the end of the erasing action.

Figure 1:
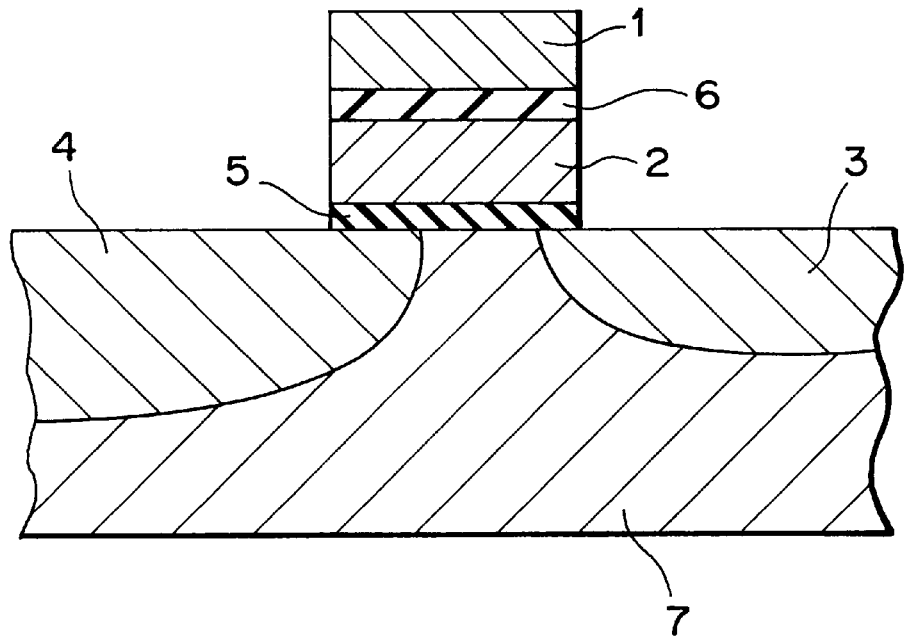
FIG. 1 is a cross sectional view showing a structure of a memory cell.
Figure 2:
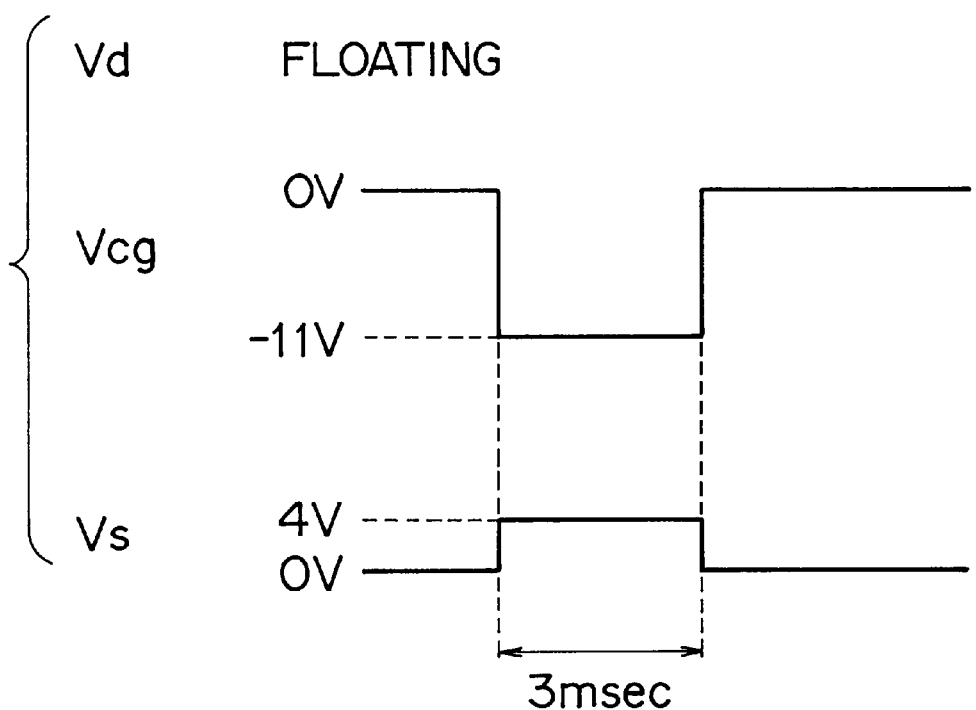
FIG. 2 is a diagram showing a conventional method of erasing memories in the memory cell.
Figure 5:
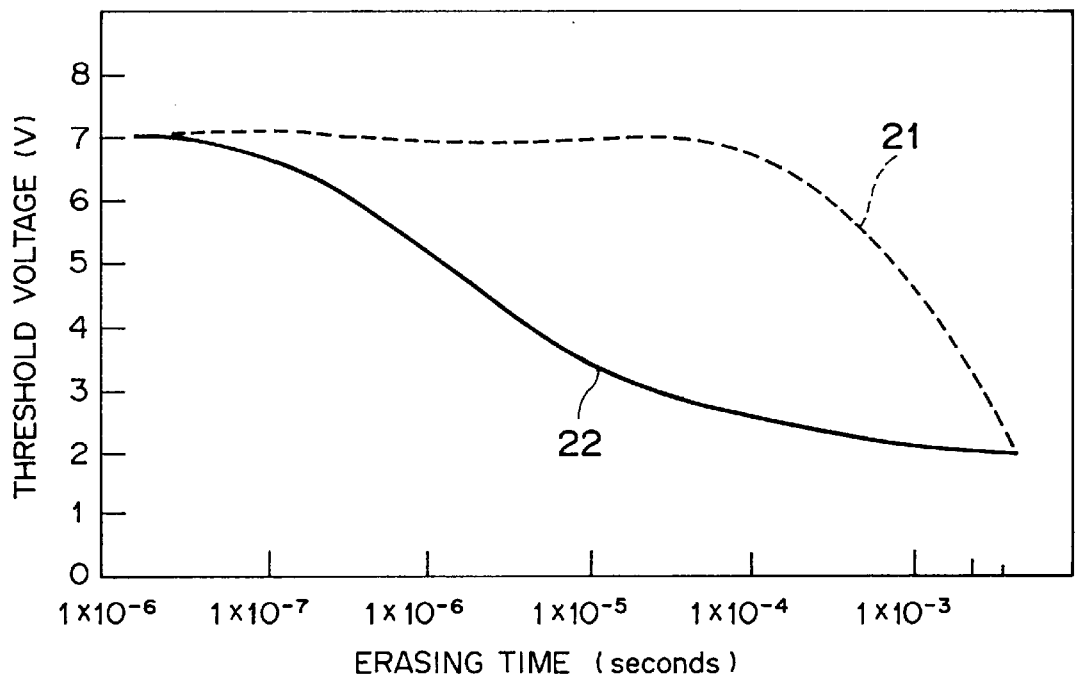
FIG. 5 is a graphic diagram showing the relation (a memory erasing profile) between the threshold voltage and the memory erasing time in which the vertical axis represents the threshold voltage and the horizontal axis represents the erasing time.

FIG. 5 is a graphic diagram showing the relation (a memory erasing profile) between the threshold voltage and the memory erasing time in which the vertical axis represents the threshold voltage and the horizontal axis represents the erasing time. It is noted in FIG. 5 that the broken line 21 is a memory erasing profile resulting from erasing memories with the method of the first embodiment of the present invention and the real line 22 is a memory erasing profile of the conventional memory erasing method shown in FIG. 2.

As apparent from FIG. 5, when the conventional memory erasing method is used for erasing memories, the threshold voltage declines immediately (precisely, about $1 \times 10^{-7}$ second later) after the start of the erasing action (the application of the pulse voltage). This indicates that the quantity of memory in the floating gate 12 is decreased just after the start of the erasing action. When the memory is erased by the method of the first embodiment, the threshold voltage starts dropping only $1 \times 10^{-4}$ second after the start of the erasing action. The method of the first embodiment however allows the threshold voltage to be decreased to a certain level at the end of the erasing action (3 msec after the start of the erasing action) and can thus erase the memory in the same period of time as of the conventional memory erasing method.

Figure 6:
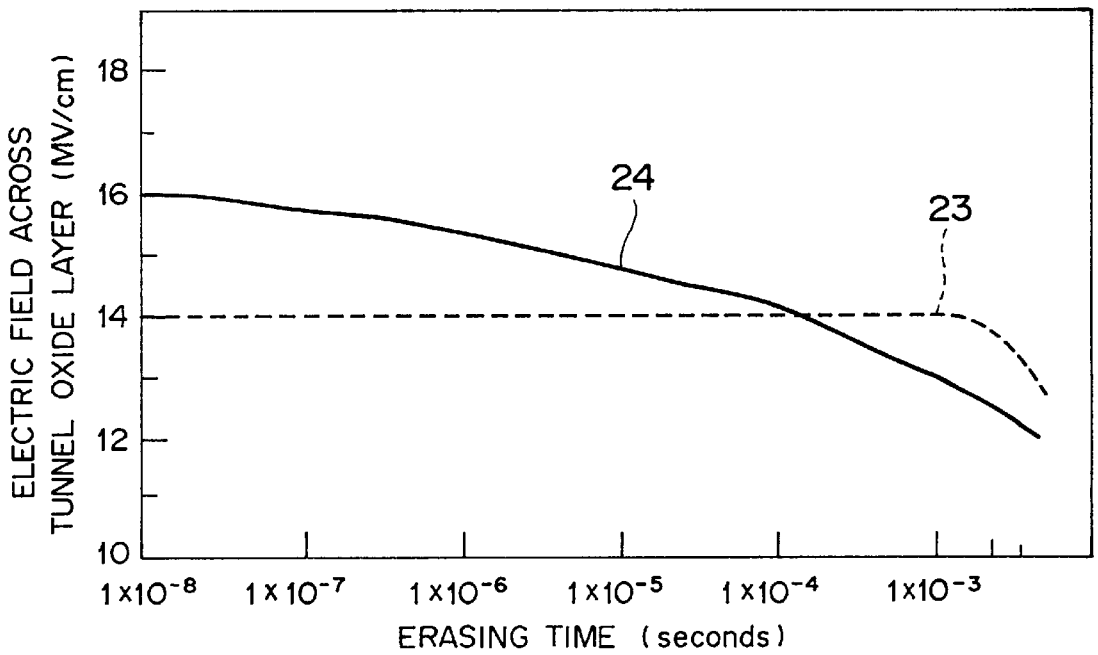
FIG. 6 is a graphic diagram showing the relation between the intensity of an electric field applied to a tunnel oxide layer and the memory erasing time in which the vertical axis represents the electric field intensity applied to the tunnel oxide layer and the horizontal axis represents the erasing time.

FIG. 6 is a graphic diagram showing the relation between the intensity of an electric field applied to a tunnel oxide layer and the memory erasing time in which the vertical axis represents the electric field intensity applied to the tunnel oxide layer and the horizontal axis represents the erasing time. It is noted in FIG. 6 that the broken line 23 is a simulated profile of the intensity of the electric field in relation to the memory erasing time when the memory is erased by the method of the first embodiment of the present invention and the real line 24 is a simulated profile of the same when the memory is erased by the conventional memory erasing method shown in FIG. 2.

As apparent from FIG. 6, the conventional memory erasing method causes electrons accumulated in the floating gate 2 to develop a high intensity of electric field (about 16 MV/cm) across the tunnel oxide layer 5 at the start of the memory erasing action. This may accelerate the escape of electrons and increase the erasing speed, but generate a higher electric field stress hence causing trapping of electrons in the tunnel oxide layer 5.

The method of the first embodiment allows the control gate 11 to be loaded with a voltage pulse of 10 V to 12 V shown in FIG. 4 in the beginning of the memory erasing action (for a period of 0 to 2 msec from the start of the memory erasing action) thus limiting the electric field across the tunnel oxide layer 15 to as a low level as 14 MV/cm. The voltage applied to the control gate 11 remains at 12 V after predetermined amount of electrons in the floating gate 12 have been removed, namely, for a period of 2 to 3 msec from the start of the memory erasing action.

As the result of memory erasing by the method of the first embodiment, the intensity of electric field across the tunnel oxide layer 15 increases higher after 0.1 msec from the start of the erasing action (the application of the pulse voltage) than that of the conventional method. However, the tunnel oxide layer 15 is hardly affected by the electric field stress at the start of the memory erasing action of the embodiment. Accordingly, the write/erase endurance will be improved and the memory will be erased to as a low level as the threshold voltage within 3 msec, similar to the effect of the conventional memory erasing method.

Figure 7:
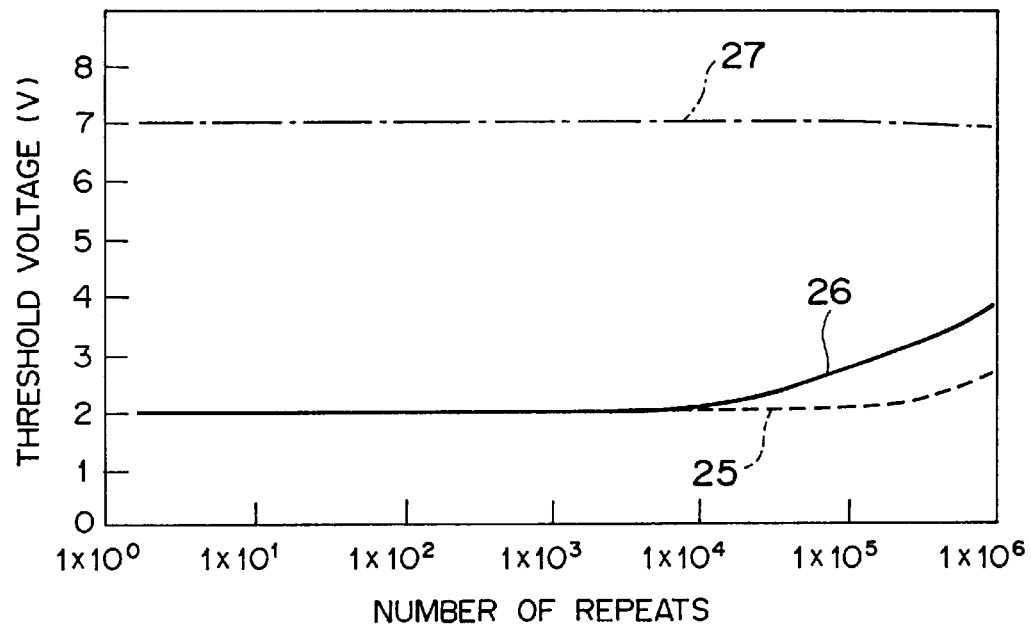
FIG. 7 is a graphic diagram showing the relation (a write/erase endurance profile) between the threshold voltage and the number of repeating actions in which the vertical axis represents the threshold voltage and the horizontal axis represents the number of repeats.

FIG. 7 is a graphic diagram showing the relation (a write/erase endurance profile) between the threshold voltage and the number of repeating actions in which the vertical axis represents the threshold voltage and the horizontal axis represents the number of repeats. It is noted in FIG. 7 that the broken line 25 is a profile of the threshold voltage when memories have been erased by the memory erasing method of the first embodiment of the present invention and the real line 26 is a profile of the same when memories have been erased by the conventional memory erasing method shown in FIG. 2. The one-dot chain line 27 is a profile of the threshold voltage when memories are saved.

As apparent from FIG. 7, the threshold voltage remains a stable low level until the number of repeating actions comes to 10000 but the threshold voltage increases close to a memory saved level (the one-dot chain line 27) after 10000 times in the conventional memory erasing method. The memory erasing method of the first embodiment however permits the threshold voltage to remain stable low level until the number of repeating actions is as high as 100000. The method of the first embodiment will successfully increase the write/erase endurance of the semiconductor memory device.

Figure 8:
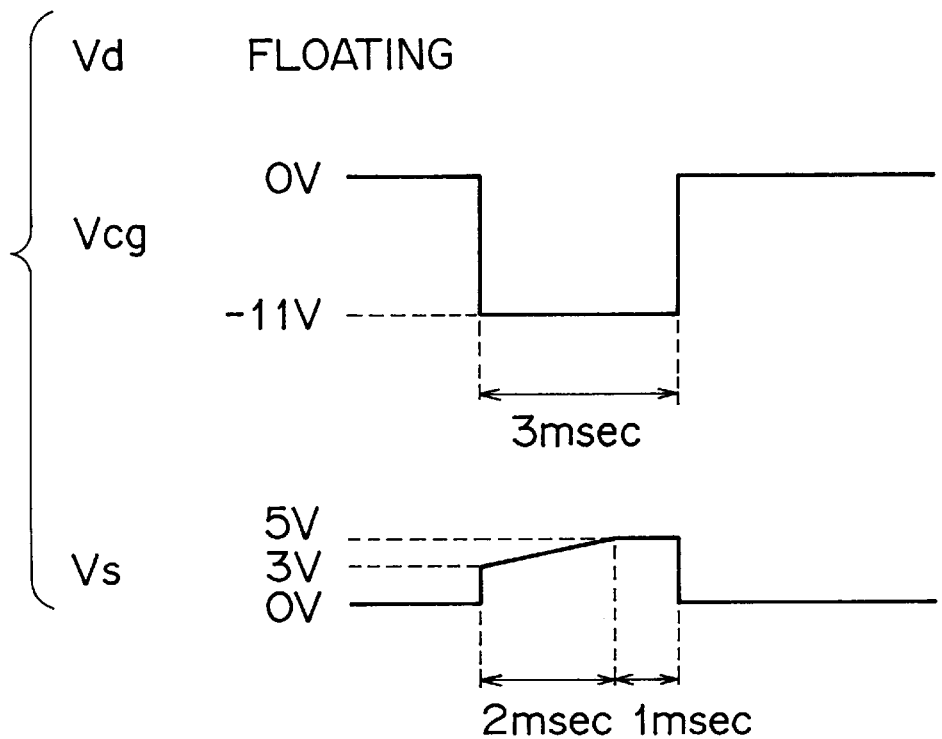
FIG. 8 is a diagram showing a second embodiment of the erasing method in a nonvolatile semiconductor memory device of the present invention.

FIG. 8 is a diagram showing a second embodiment of the erasing method in a nonvolatile semiconductor memory device of the present invention. The second embodiment, like the first embodiment, is associated with the nonvolatile semiconductor memory device (a memory cell) shown in FIG. 3. It is also assumed in FIG. 8 that the voltage applied to the drain region 13 shown in FIG. 3 is Vd, the voltage applied to the control gate 11 is Vcg, and the voltage applied to the source region 14 is Vs.

As shown in FIG. 8, in the memory erasing action of the second method, the drain region 13 is at a floating state and the control gate 11 is loaded with a constant voltage pulse of e.g. −11 V. The source region 14 is supplied with such a voltage pulse as determined by Equations (3) and (4), where $Vs(t,t+\Delta t)$ is a voltage applied to the source region 14 for memory erasing action. It is now assumed that $\Delta t=0.1$ msec, $Vs(0)=3$ V, and $dVs=0.1$ V.

When $0 \leq t < 2$ (msec) is established, $$Vs(t,t+\Delta t)=Vs(0)+dvs \times t \quad (3)$$

When $2 \leq t \leq 3$ (msec) is established, $$Vs=5 \quad (4)$$

When the voltage determined by Equation (3) and (4) is applied to the source region 14, the source region voltage increases with time or more specifically in a period from the start of the memory erasing action (application of the pulse voltage) to 2 msec later. After 2 msec, the voltage applied to the source region 14 remains constant until the erasing action is terminated.

While the control gate is loaded with the constant voltage pulse, a difference of the potential between the voltage applied to the source region and the voltage applied to the control gate at the start of the erasing action is smaller than that at the end of the erasing action.

As described, the memory erasing method of the second embodiment where the voltage applied to the source region is controlled, like the method of the first embodiment, prevents the tunnel oxide layer 15 from receiving high electric field stress at the start of the memory erasing action hence improving the write/erase endurance.

Generally in the action of erasing memories, pairs of electron and hole are produced by interband tunneling effect and the holes are accelerated by a crosswise component of the electric field, causing avalanche breakdown and thus generating a great number of hotholes. The second embodiment permits the voltage input to the source region at the start of the memory erasing action to be smaller than the voltage input at the end of the erasing action, hence attenuating the crosswise component of the electric field and decreasing the number of generating hotholes. Accordingly, the memory erasing method of the second embodiment can minimize the degradation of the tunnel oxide layer 15 caused by hotholes migrating to the tunnel oxide layer 15 at the start of the memory erasing action.

What is claimed is:

1. An erasing method in a nonvolatile semiconductor memory device having: a semiconductor substrate of a first conductivity type, a source region and a drain region of a second conductivity type formed selectively at the surface of said semiconductor substrate, a first insulating layer formed on said semiconductor substrate, a floating gate formed on said first insulating layer, a second insulating layer formed on said floating gate, and a control gate formed on said second insulating layer, comprising the step of:

applying a negative voltage pulse to said control gate and a positive voltage pulse to said source region while said drain region being at a floating state, said negative and positive voltage pulses being controlled so that a difference between the voltage applied to said control gate and the voltage applied to said source region at the start of said pulse voltage application is smaller than that at the end of said pulse voltage application.

2. An erasing method according to claim 1, wherein the absolute value of the voltage applied to either said control gate or said source region at said start of said pulse voltage application is smaller than that at said end of said pulse voltage application and the absolute value of the voltage applied to the other is constant.

3. An erasing method according to claim 1, wherein said voltage pulse applied to said source region is a constant voltage pulse and said voltage pulse applied to said control gate is a voltage pulse that its absolute value increases with time from the start of said pulse voltage application.

4. An erasing method according to claim 1, wherein said voltage pulse applied to said control gate is a constant voltage pulse and said voltage pulse applied to said source region is a voltage pulse that its amplitude increases with time from the start of said pulse voltage application.

5. A method of erasing a nonvolatile semiconductor memory device, comprising:

subjecting a control gate of the semiconductor device to a first voltage signal; and subjecting a source region of the semiconductor device to a second voltage signal, wherein at least one of the first and second voltage signals varies as a function of time to increase a voltage difference between the control gate and the source region.

6. A method, according to claim 5, wherein the voltage difference between the source region and the control gate increases linearly as a function of time.

7. A method, according to claim 5, wherein one of the voltage signals remains constant as a function of time while the other one of the voltage signals varies as a function of time.

8. A method, according to claim 7, wherein the first voltage signal remains constant.

9. A method, according to claim 8, wherein the second voltage signal increases linearly from three volts to five volts for two msec while the first voltage signal is held at negative eleven volts.

10. A method, according to claim 9, wherein the second voltage signal is held to five volts for an additional one msec.

11. A method, according to claim 7, wherein the second voltage signal remains constant.

12. A method, according to claim 11, wherein the first voltage signal decreases linearly from negative ten volts to negative twelve volts for two msec while the second voltage signal is held at four volts.

13. A method, according to claim 12, wherein the first voltage signal is held to negative twelve volts for an additional one msec.

14. A nonvolatile semiconductor memory device, comprising:
   a substrate;
   source and drain regions formed on said substrate;
   a floating gate and a control gate formed on said substrate between said source and drain regions; and
   means for erasing the device by subjecting said control gate to a first voltage signal and by subjecting said source region to a second voltage signal, wherein at least one of said first and second voltage signals varies as a function of time to increase a voltage difference between said control gate and said source region.

15. A device, according to claim 14, wherein said first voltage signal remains constant.

16. A device, according to claim 15, wherein said second voltage signal increases linearly from three volts to five volts for two msec while said first voltage signal is held at negative eleven volts.

17. A device, according to claim 16, wherein said second voltage signal is held to five volts for an additional one msec.

18. A device, according to claim 14, wherein said second voltage signal remains constant.

19. A device, according to claim 18, wherein said first voltage signal decreases linearly from negative ten volts to negative twelve volts for two msec while said second voltage signal is held at four volts.

20. A device, according to claim 19, wherein said first voltage signal is held to negative twelve volts for an additional one msec.

* * * * *